United States Patent
Hu et al.

(10) Patent No.: US 9,806,923 B2
(45) Date of Patent: Oct. 31, 2017

(54) RXLOS DEGLITCH APPARATUS AND METHOD

(71) Applicant: FARADAY TECHNOLOGY CORPORATION, Hsinchu (TW)

(72) Inventors: Yuan-Min Hu, Hsinchu (TW); Jhen-Yu Hou, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/241,618

(22) Filed: Aug. 19, 2016

(65) Prior Publication Data

US 2017/0279644 A1    Sep. 28, 2017

(30) Foreign Application Priority Data

Mar. 25, 2016  (TW) .............................. 105109488 A (51) Int. Cl.
| | |
|---|---|
| H04L 7/00 | (2006.01) |
| H03D 3/24 | (2006.01) |
| H04L 27/00 | (2006.01) |
| H03K 3/00 | (2006.01) |
| H03L 7/00 | (2006.01) |
| H03L 7/08 | (2006.01) |

(52) U.S. Cl.
CPC ........... *H04L 27/0014* (2013.01); *H03K 3/00* (2013.01); *H03L 7/00* (2013.01); *H03L 7/08* (2013.01); *H04L 2027/0036* (2013.01)

(58) Field of Classification Search
USPC ....... 375/146, 147, 211, 219, 220, 221, 222, 375/240, 240.26–240.28, 254, 257, 259, 375/284, 285, 278, 293, 294, 295, 316, 375/340, 324, 355, 356, 362, 371
See application file for complete search history.

(56) References Cited

U.S. PATENT DOCUMENTS

| | | | |
|---|---|---|---|
| 7,007,254 B1* | 2/2006 | Borkovic | G06F 17/5045 716/113 |
| 8,509,094 B2* | 8/2013 | Fuller | H04L 1/20 370/242 |
| 2001/0031028 A1* | 10/2001 | Vaucher | H03L 7/089 375/355 |
| 2004/0161068 A1* | 8/2004 | Zerbe | G11C 7/22 375/355 |
| 2006/0045224 A1* | 3/2006 | Cranford, Jr. | H04L 7/0337 375/355 |

(Continued)

OTHER PUBLICATIONS

Taiwan Patent Office "Office Action" dated May 25, 2017, Taiwan.

*Primary Examiner* — Linda Wong
(74) *Attorney, Agent, or Firm* — Winston Hsu (57) ABSTRACT

A RXLOS deglitch apparatus for a receiver is provided. The RXLOS deglitch apparatus includes a sampler, an edge detecting unit and a finite state machine. The sampler receives a recovered clock, and samples a RXLOS signal according to the recovered clock. Consequently, a sampled RXLOS signal is generated. The edge detecting unit receives the RXLOS signal. When a logic level of the RXLOS signal is changed, an edge detection signal is activated by the edge detecting unit. The finite state machine receives the edge detection signal and the sampled RXLOS signal, generates an edge rest signal to control the edge detecting unit, and outputs a filtered RXLOS signal.

12 Claims, 5 Drawing Sheets

(56) References Cited

U.S. PATENT DOCUMENTS

| | | | |
|---|---|---|---|
| 2006/0062341 A1* | 3/2006 | Edmondson | H03L 7/0814 375/376 |
| 2006/0140318 A1* | 6/2006 | Farjad-rad | H04L 7/033 375/355 |
| 2007/0140397 A1* | 6/2007 | Jaussi | H03L 7/07 375/371 |
| 2010/0309791 A1* | 12/2010 | Fuller | H04L 1/20 370/242 |
| 2011/0215852 A1* | 9/2011 | Klein | H03L 7/00 327/161 |
| 2012/0154059 A1* | 6/2012 | van der Wel | H03L 7/087 331/34 |
| 2012/0183104 A1* | 7/2012 | Hong | H03L 7/085 375/340 |
| 2012/0281992 A1 | 11/2012 | Cai et al. | |
| 2013/0113534 A1* | 5/2013 | Wachi | H03L 7/091 327/148 |
| 2013/0259166 A1* | 10/2013 | Oh | G06F 17/5059 375/340 |
| 2014/0140385 A1* | 5/2014 | Ye | H04L 27/01 375/230 |
| 2015/0244549 A1* | 8/2015 | Crain | H03L 7/00 375/316 |
| 2015/0303791 A1 | 10/2015 | Jin et al. | |
| 2015/0312066 A1* | 10/2015 | Liao | H04L 25/03159 375/232 |
| 2016/0043861 A1* | 2/2016 | Lee | H03L 7/0814 375/371 |
| 2016/0147281 A1* | 5/2016 | Ware | G11C 7/04 713/320 |

* cited by examiner

RXLOS DEGLITCH APPARATUS AND METHOD

This application claims the benefit of Taiwan Patent Application No. 105109488, filed Mar. 25, 2016, the subject matter of which is incorporated herein by reference.

FIELD OF THE INVENTION

The present invention relates to a signal processing apparatus and a signal processing method, and more particularly to a RXLOS deglitch apparatus and a RXLOS deglitch method.

BACKGROUND OF THE INVENTION

A serializer/deserializer (also referred as SerDes) is usually used in high speed communications. In the SerDes application, a transmitter (Tx) converts a parallel data into a serial data and then the serial data is transmitted to a receiver (Rx) according to a differential signal (D+, D−).

Generally, a front end circuit of the receiver (Rx) comprises a data clock recovery circuit. The data clock recovery circuit generates a recovered data and a recovered clock according to the differential signal (D+, D−) from the transmitter (Tx). A rear end controller of the receiver (Rx) samples the recovered data according to the recovered clock.

Moreover, the front end circuit of the receiver (Rx) further comprises an analog detection circuit. The analog detection circuit generates a receiver loss of signal (also referred as a RXLOS signal) according to the differential signal (D+, D−) and transmits the RXLOS signal to the rear end controller.

Generally, the RXLOS signal outputted from the front end circuit of the receiver (Rx) is a digital data indicating whether a usable data presence status or a usable data absence status is detected. Consequently, the rear end controller processes the recovered data according to the RXLOS signal. For example, if the analog detection circuit judges that the receiver is in the usable data absence status according to the differential signal (D+, D−), the RXLOS signal outputted from the analog detection circuit has a first logic level (e.g., a high level). Whereas, if the analog detection circuit judges that the receiver is in the usable data presence status according to the differential signal (D+, D−), the RXLOS signal outputted from the analog detection circuit has a second logic level (e.g., a low level).

However, in the conventional high-speed SerDes architecture, the analog detection circuit of the receiver (Rx) cannot stably generate the RXLOS signal. Consequently, the RXLOS signal contains many glitches. When the RXLOS signal containing glitches is received by the rear end controller, the RXLOS signal may lead to erroneous operation of the rear end controller. Under this circumstance, the operation of the SerDes is very unstable.

SUMMARY OF THE INVENTION

An embodiment of the present invention provides a RXLOS deglitch apparatus for a receiver. The RXLOS deglitch apparatus includes a sampler, an edge detecting unit and a finite state machine. The sampler receives a recovered clock, and samples a RXLOS signal according to the recovered clock. Consequently, a sampled RXLOS signal is generated. The edge detecting unit receives the RXLOS signal. When a logic level of the RXLOS signal is changed, an edge detection signal is activated by the edge detecting unit. The finite state machine receives the edge detection signal and the sampled RXLOS signal, generates an edge rest signal to control the edge detecting unit, and outputs a filtered RXLOS signal.

Another embodiment of the present invention provides a RXLOS deglitch method for processing a sampled RXLOS signal and an edge detection signal. The RXLOS deglitch method includes the following steps. In a step (a), the sampled RXLOS signal is set to be in a first logic level state, and the edge detection signal is set to be inactivated. Then, a step (b) is performed to judge whether the sampled RXLOS signal is in a second logic level state or the edge detection signal is activated. If a judging condition of the step (b) is not satisfied, the step (a) is repeatedly done. If the judging condition of the step (b) is satisfied, the edge detection signal is set to be inactivated and then a step (c) is performed. Then, a step (c) is performed to judge whether the sampled RXLOS signal is in the second logic level state or the edge detection signal is activated within a first time interval. If a judging condition of the step (c) is not satisfied, the step (a) is repeatedly done. If the judging condition of the step (c) is satisfied, a step (d) is performed. In a step (d), a filtered RXLOS signal is set to be in the second logic level state and the edge detection signal is set to be inactivated, and then a step (e) is performed. Then, a step (e) is performed to judge whether the sampled RXLOS signal is in the first logic level state. If a judging condition of the step (e) is not satisfied, the step (d) is repeatedly done. If the judging condition of the step (e) is satisfied, a step (f) is performed. Then, the step (f) is performed to judge whether the sampled RXLOS signal is in the second logic level state or the edge detection signal is activated within a second time interval. If a judging condition of the step (f) is satisfied, the step (d) is repeatedly done. If the judging condition of the step (f) is not satisfied, the filtered RXLOS signal is set to be in the first logic level state and the edge detection signal is set to be inactivated, and the step (a) is repeatedly done.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Generally, a front end circuit of the receiver (Rx) comprises a data clock recovery circuit. The data clock recovery circuit generates a recovered clock rx_clk. Moreover, an analog detection circuit of the front end circuit generates a RXLOS signal rx_los.

The present invention provides a RXLOS deglitch apparatus and a RXLOS deglitch method. The RXLOS deglitch apparatus is connected between the front end circuit and a rear end controller of the receiver (Rx). Moreover, the RXLOS deglitch apparatus receives the recovered clock rx_clk and the RXLOS signal rx_los. After the glitches contained in the RXLOS signal rx_los are filtered off by the RXLOS deglitch apparatus, the filtered RXLOS signal rx_los is outputted to the rear end controller. Consequently, the rear end controller can be normally operated.

Figure 1:
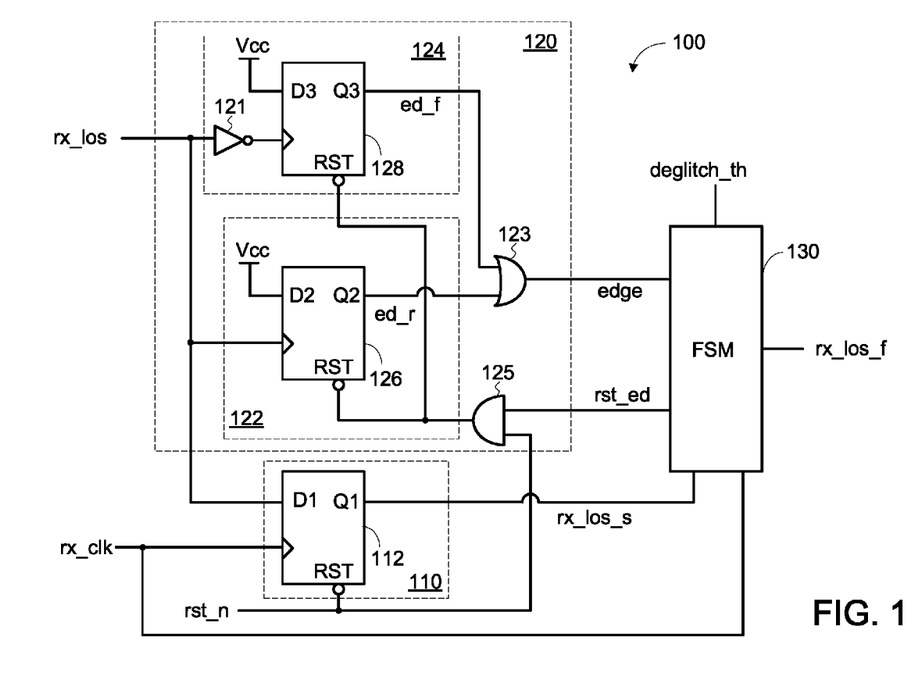
FIG. 1 is a schematic circuit diagram illustrating a RXLOS deglitch apparatus according to an embodiment of the present invention.

FIG. 1 is a schematic circuit diagram illustrating a RXLOS deglitch apparatus according to an embodiment of the present invention. As shown in FIG. 1, the RXLOS deglitch apparatus 100 comprises a sampler 110, an edge detecting unit 120 and a finite state machine (FSM) 130.

The sampler 110 samples the RXLOS signal rx_los according to the recovered clock rx_clk and outputs a sampled RXLOS signal rx_los_s. In this embodiment, the sampler 110 comprises a D flip-flop 112. In a normal working state, a signal input terminal D1 of the D flip-flop 112 receives the RXLOS signal rx_los, a clock input terminal of the D flip-flop 112 receives the recovered clock rx_clk, and an output terminal Q1 of the D flip-flop 112 generates the sampled RXLOS signal rx_los_s. Moreover, a reset terminal RST of the D flip-flop 112 receives a system reset signal rst_n. When the system reset signal rst_n is activated, the D flip-flop 112 is reset. When the system reset signal rst_n is inactivated, the D flip-flop 112 is in the normal working state.

The edge detecting unit 120 receives the RXLOS signal rx_los. When the logic level of the RXLOS signal rx_los is changed, an edge detection signal (edge) is activated by the edge detecting unit 120. In this embodiment, the edge detecting unit 120 comprises a rising edge detector 122 and a falling edge detector 124. When the RXLOS signal rx_los is switched from a second logic level state to a first logic level state, for example switched from a low level state to a high level state, the rising edge detector 122 activates a rising edge detection signal ed_r. When the RXLOS signal rx_los is switched from the first logic level state to the second logic level state, for example switched from the logic level state to the low level state, the falling edge detector 124 activates a falling edge detection signal ed_f. Moreover, whenever one of the rising edge detection signal ed_r and the falling edge detection signal ed_f is activated, it means that the edge detection signal (edge) is activated.

Moreover, the operations of the rising edge detector 122 and the falling edge detector 124 are determined according to the system reset signal rst_n and an edge rest signal rst_ed. When one of the system reset signal rst_n and the edge rest signal rst_ed is activated, the rising edge detector 122 and the falling edge detector 124 are reset. When both of the system reset signal rst_n and the edge rest signal rst_ed are inactivated, the rising edge detector 122 and the falling edge detector 124 are in the normal working state.

In the edge detecting unit 120, the rising edge detector 122 comprises a D flip-flop 126, and the falling edge detector 124 comprises a D flip-flop 128. In the normal working state, a signal input terminal D2 of the D flip-flop 126 receives a first logic level Vcc, a clock input terminal of the D flip-flop 126 receives the RXLOS signal rx_los, and an output terminal Q2 of the D flip-flop 126 generates the rising edge detection signal ed_r. Moreover, a signal input terminal D3 of the D flip-flop 128 receives the first logic level Vcc, a clock input terminal of the D flip-flop 128 receives an inverted RXLOS signal rx_los, and an output terminal Q3 of the D flip-flop 128 generates the falling edge detection signal ed_f. Moreover, the inverted RXLOS signal rx_los is generated after the RXLOS signal rx_los is processed by an inverter 121.

In an embodiment, the rising edge detection signal ed_r and the falling edge detection signal ed_f are activated when they are in the high level state. Consequently, the rising edge detection signal ed_r and the falling edge detection signal ed_f are respectively received by two input terminals of an OR gate 123, and the edge detection signal (edge) is outputted from an output terminal of the OR gate 123. That is, when one of the rising edge detection signal ed_r and the falling edge detection signal ed_f is activated, the edge detection signal (edge) is activated.

Moreover, the system reset signal rst_n and the edge rest signal rst_ed are activated when they are in the low level state. Consequently, the system reset signal rst_n and the edge rest signal rst_ed are respectively received by two input terminals of an AND gate 125, and an output terminal of the AND gate 125 is connected with a reset terminal RST of the D flip-flop 126 and a reset terminal RST of the D flip-flop 128. In other words, when one of the system reset signal rst_n and the edge rest signal rst_ed is activated, the rising edge detector 122 and the falling edge detector 124 are reset. When both of the system reset signal rst_n and the edge rest signal rst_ed are inactivated, the rising edge detector 122 and the falling edge detector 124 are in the normal working state.

The finite state machine 130 is operated according to the recovered clock rx_clk. Moreover, the finite state machine 130 receives the sampled RXLOS signal rx_los_s, the edge detection signal (edge) and a deglitch threshold deglitch_th, and generates a filtered RXLOS signal rx_los_f.

Figure 2:
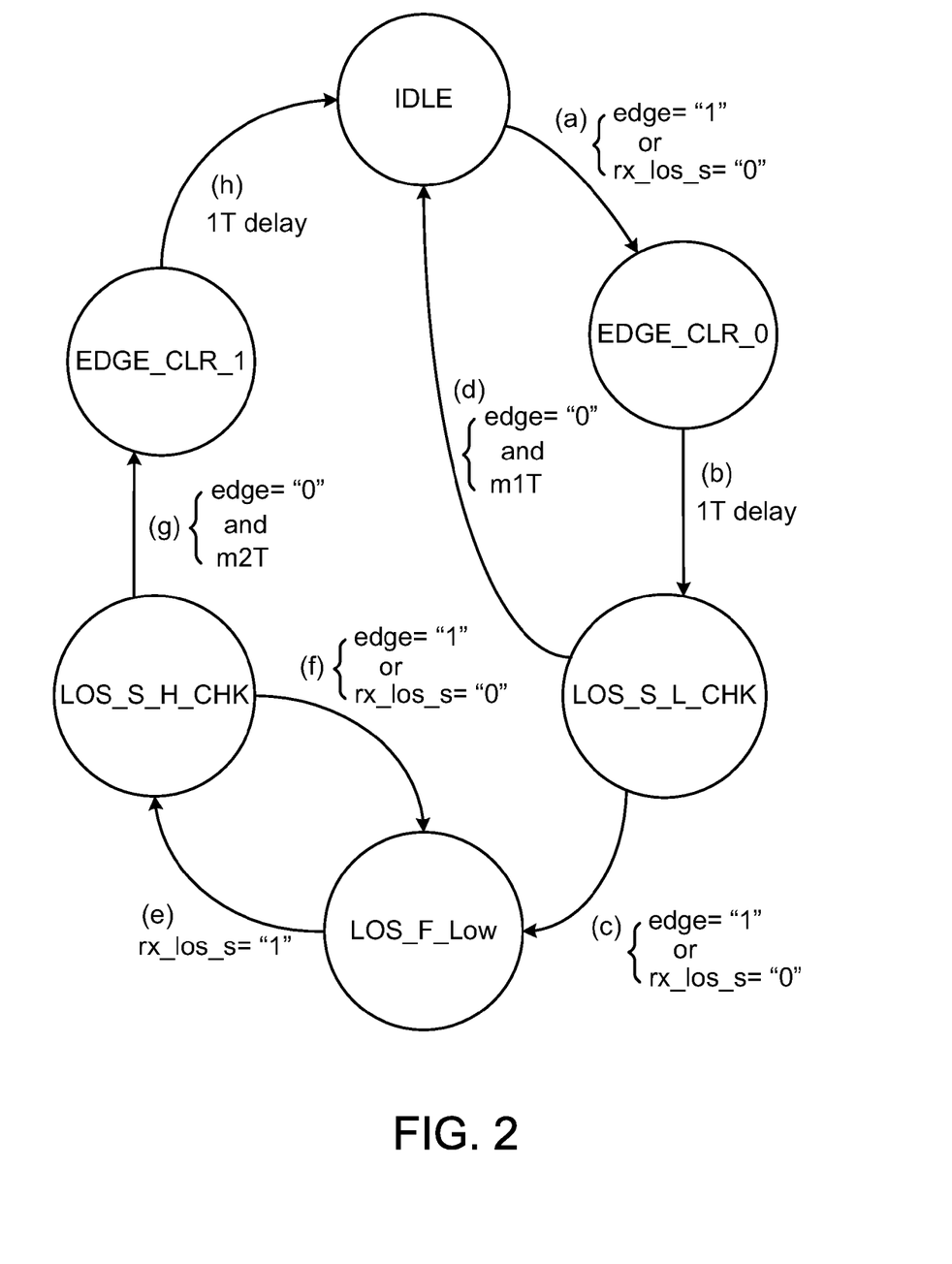
FIG. 2 is a schematic state diagram of the finite state machine of RXLOS deglitch apparatus according to the embodiment of the present invention.

FIG. 2 is a schematic state diagram of the finite state machine of RXLOS deglitch apparatus according to the embodiment of the present invention. Please refer to FIGS. 1 and 2. The finite state machine 130 has six states, including an idle state (IDLE), a first clear state (EDGE_CLR_0), a first check state (LOS_S_L_CHK), a filtered RXLOS signal "0" state (LOS_F_Low), a second check state (LOS_S_H_CHK) and a second clear state (EDGE_CLR_1). Generally, the deglitch threshold deglitch_th provides a first value m1 and a second value m2 to the finite state machine 130. The first value m1 and the second value m2 are identical or different. In the following descriptions, both of the first value m1 and the second value m2 are 3.

First of all, the system reset signal rst_n is activated, and thus the sampler 110 and the edge detecting unit 120 are rest. Under this circumstance, the finite state machine 130 enters the idle state (IDLE). Moreover, the filtered RXLOS signal rx_los_f generated by the finite state machine 130 is in a high level state, indicating a usable data absence status.

When the finite state machine 130 is in the idle state (IDLE) and the condition (a) is satisfied, the finite state machine 130 enters the first clear state (EDGE_CLR_0). For example, if the edge detection signal (edge) is activated (e.g., in a high level state) or the sampled RXLOS signal rx_los_s is in a second logic level state (e.g., a low level state), it means that the RXLOS signal rx_los is changed from the high level state to the low level state or changed from the low level state to the high level state. Under this circumstance, the finite state machine 130 enters the first clear state (EDGE_CLR_0).

In the first clear state (EDGE_CLR_0), the edge rest signal rst_ed is activated by the finite state machine 130.

Moreover, when the finite state machine 130 enters the first clear state (EDGE_CLR_0) and the condition (b) is satisfied, the finite state machine 130 enters the first check state (LOS_S_L_CHK). Since the edge rest signal rst_ed is activated when the finite state machine 130 is in the first clear state (EDGE_CLR_0), the edge detection signal (edge) is inactivated (e.g., in the low level state). Moreover, after one cycle time of the recovered clock rx_clk is delayed, the finite state machine 130 enters the first check state (LOS_S_L_CHK).

When the finite state machine 130 is in the first check state (LOS_S_L_CHK) and the condition (c) is satisfied, the finite state machine 130 enters the filtered RXLOS signal "0" state (LOS_F_Low). Alternatively, when the finite state machine 130 is in the first check state (LOS_S_L_CHK) and the condition (d) is satisfied, the finite state machine 130 enters the idle state (IDLE).

If the edge detection signal (edge) is activated again (e.g., in the high level state) or the sampled RXLOS signal rx_los_s is maintained in the second logic level state (e.g., the low level state or a usable data presence status) when the finite state machine 130 is in the first check state (LOS_S_L_CHK), it means that the condition (c) is satisfied. Under this circumstance, the finite state machine 130 enters the filtered RXLOS signal "0" state (LOS_F_Low). Whereas, if the edge detection signal (edge) is inactivated (e.g., in the low level state) and maintained in the low level state for m1T (e.g., 3T), the finite state machine 130 enters the idle state (IDLE).

When the finite state machine 130 is in the filtered RXLOS signal "0" state (LOS_F_Low) and the condition (e) is satisfied, the finite state machine 130 enters the second check state (LOS_S_H_CHK). Generally, when the finite state machine 130 is in the filtered RXLOS signal "0" state (LOS_F_Low), the filtered RXLOS signal rx_los_f is changed to the low level state, indicating a usable data presence status. When the finite state machine 130 is in the filtered RXLOS signal "0" state (LOS_F_Low), the finite state machine 130 activates the edge rest signal rst_ed until the finite state machine 130 leaves the filtered RXLOS signal "0" state (LOS_F_Low). Moreover, when the sampled RXLOS signal rx_los_s is changed to the first logic level state (e.g., the high level state), the finite state machine 130 enters the second check state (LOS_S_H_CHK).

When the finite state machine 130 is in the second check state (LOS_S_H_CHK) and the condition (f) is satisfied, the finite state machine 130 enters the filtered RXLOS signal "0" state (LOS_F_Low) again. Whereas, when the finite state machine 130 is in the second check state (LOS_S_H_CHK) and the condition (g) is satisfied, the finite state machine 130 enters the second clear state (EDGE_CLR_1).

If the edge detection signal (edge) is activated again (e.g., in the high level state) or the sampled RXLOS signal rx_los_s is changed again to the second logic level state (e.g., the low level state or the usable data presence status) when the finite state machine 130 is in the second check state (LOS_S_H_CHK), it means that the condition (f) is satisfied. Under this circumstance, the finite state machine 130 enters the filtered RXLOS signal "0" state (LOS_F_Low). Whereas, if the edge detection signal (edge) is inactivated (e.g., in the low level state) and maintained in the low level state for m2T (e.g., 3T), the finite state machine 130 enters the second clear state (EDGE_CLR_1).

When the finite state machine 130 is in the second clear state (EDGE_CLR_1), the edge rest signal rst_ed is activated by the finite state machine 130. Moreover, when the finite state machine 130 enters the second clear state (EDGE_CLR_1) and the condition (h) is satisfied, the finite state machine 130 enters the idle state (IDLE). Since the edge rest signal rst_ed is activated when the finite state machine 130 is in the second clear state (EDGE_CLR_1), the edge detection signal (edge) is inactivated (e.g., in the low level state). Moreover, after one cycle time of the recovered clock rx_clk is delayed, the finite state machine 130 enters the idle state (IDLE).

Figure 3:
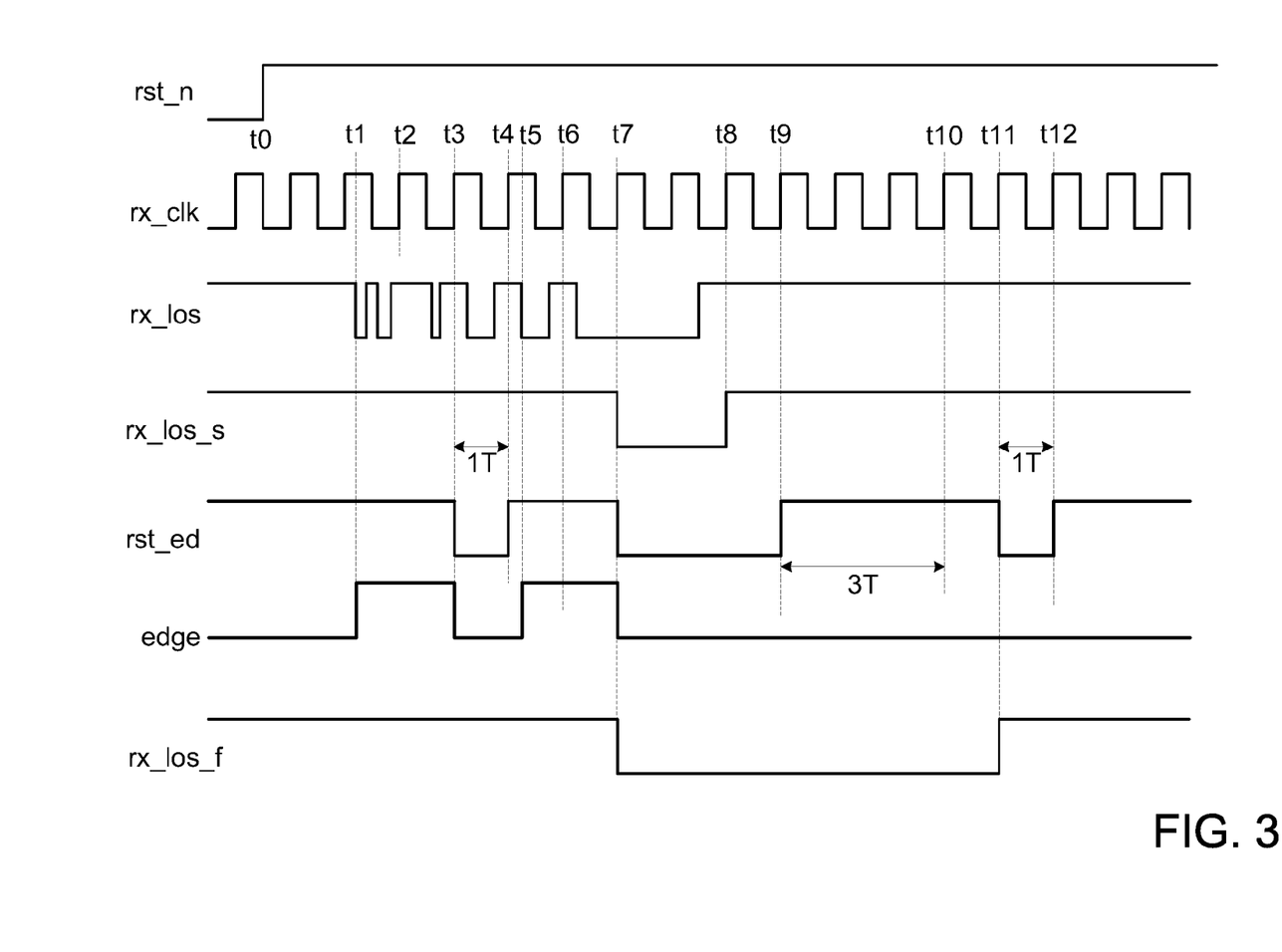
FIG. 3 is a schematic timing waveform diagram illustrating the signals processed by the RXLOS deglitch apparatus according to the embodiment of the present invention.

FIG. 3 is a schematic timing waveform diagram illustrating the signals processed by the RXLOS deglitch apparatus according to the embodiment of the present invention.

Before the time point t0, the system reset signal rst_n is activated (e.g., in the low level state). Consequently, the sampler 110 and the edge detecting unit 120 are rest. After the time point t0, the finite state machine 130 is in the idle state (IDLE).

At the time point t1, the level state of the RXLOS signal rx_los starts to be changed, and the edge detection signal (edge) is activated (e.g., from the low level state to the high level state).

At the time t2, the finite state machine 130 confirms that the edge detection signal (edge) is activated (e.g., in the high level state). Consequently, the finite state machine 130 enters the first clear state (EDGE_CLR_0). After the finite state machine 130 enters the first clear state (EDGE_CLR_0), the finite state machine 130 activates the edge rest signal rst_ed at the time point t3.

Moreover, after one cycle time of the recovered clock rx_clk is delayed, the finite state machine 130 enters the first check state (LOS_S_L_CHK) at the time point t4.

At the time point t5, the edge detection signal (edge) is activated (e.g., in the high level state) again. At the time t6, the finite state machine 130 confirms that the edge detection signal (edge) is activated (e.g., in the high level state). Consequently, the finite state machine 130 enters the filtered RXLOS signal "0" state (LOS_F_Low).

After the finite state machine 130 is in the filtered RXLOS signal "0" state (LOS_F_Low), the filtered RXLOS signal rx_los_f is changed from the high level state to the low level state at the time point t7. Moreover, at the time point t7, the finite state machine 130 activates the edge rest signal rst_ed (e.g., in the low level state).

At the time point t8, the sampled RXLOS signal rx_los_s is changed to the first logic level state (e.g., the high level state). At the time point t9, the finite state machine 130 confirms that the sampled RXLOS signal rx_los_s is changed to the high level state. Consequently, the finite state machine 130 enters the second check state (LOS_S_H_CHK), and the edge rest signal rst_ed is inactivated.

In the time interval from the time point t9 and the time point t10, the finite state machine 130 confirms that the edge detection signal (edge) is maintained in the low level state for m2T (e.g., 3T). Consequently, at the time point t10, the finite state machine 130 enters the second clear state (EDGE_CLR_1).

After the finite state machine 130 is in the second clear state (EDGE_CLR_1), the filtered RXLOS signal rx_los_f is changed from the low level state to the high level state at the time point t11. Moreover, the edge rest signal rst_ed is activated (e.g., in the low level state) by the finite state machine 130.

After one cycle time of the recovered clock rx_clk is delayed, the finite state machine 130 enters the idle state (IDLE) at the time point t12.

As shown in FIG. 3, the RXLOS signal rx_los has many glitches. In comparison with the RXLOS signal rx_los, the filtered RXLOS signal rx_los_f has no glitches.

Figure 4:
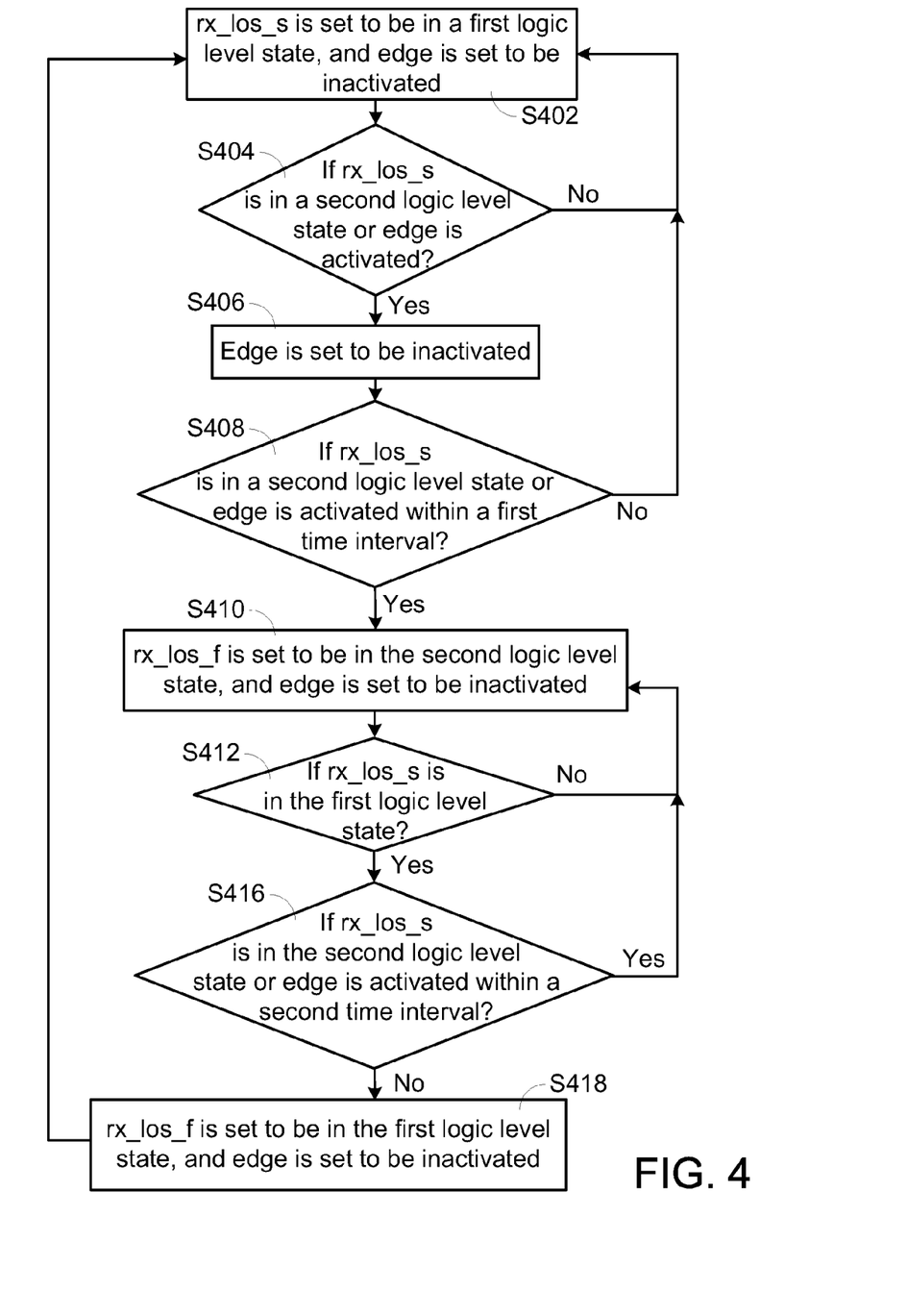
FIG. 4 is a flowchart of a RXLOS deglitch method according to an embodiment of the present invention.

FIG. 4 is a flowchart of a RXLOS deglitch method according to an embodiment of the present invention. Generally, the sampler 110 samples the RXLOS signal rx_los according to the recovered clock rx_clk and outputs the sampled RXLOS signal rx_los_s. Moreover, when the logic level of the RXLOS signal rx_los is changed, the edge detection signal (edge) is activated by the edge detecting unit. Moreover, when the edge detecting unit is reset, the edge detection signal (edge) is inactivated.

Firstly, the sampled RXLOS signal rx_los_s is set to be in a first logic level state, and the edge detection signal (edge) is set to be inactivated (Step S402).

Then, a step S404 is performed to judge whether the sampled RXLOS signal rx_los_s is in a second logic level state or the edge detection signal (edge) is activated (Step S404).

If the judging condition of the step S404 is not satisfied, the step S402 is repeatedly done. Whereas, if the judging condition of the step S404 is satisfied, the edge detection signal (edge) is set to be inactivated (Step S406).

Then, a step S408 is performed to judge whether the sampled RXLOS signal rx_los_s is in the second logic level state or the edge detection signal (edge) is activated within a first time interval (m1T) (Step S408). If the judging condition of the step S408 is not satisfied, the step S402 is repeatedly done. If the judging condition of the step S408 is satisfied, the filtered RXLOS signal rx_los_f is set to be in the second logic level state and the edge detection signal (edge) is set to be inactivated (Step S410).

Then, a step S412 is performed to judge whether the sampled RXLOS signal rx_los_s is in the first logic level state. If the judging condition of the step S412 is not satisfied, the step S410 is repeatedly done. If the judging condition of the step S412 is satisfied, a step S412 is performed to judge whether the sampled RXLOS signal rx_los_s is in the second logic level state or the edge detection signal (edge) is activated within a second time interval (m2T) (Step S416).

If the judging condition of the step S416 is satisfied, the step S410 is repeatedly done. If the judging condition of the step S416 is not satisfied, the filtered RXLOS signal rx_los_f is set to be in the first logic level state and the edge detection signal (edge) is set to be inactivated (Step S418), and the step S402 is repeatedly done.

Figure 5A:
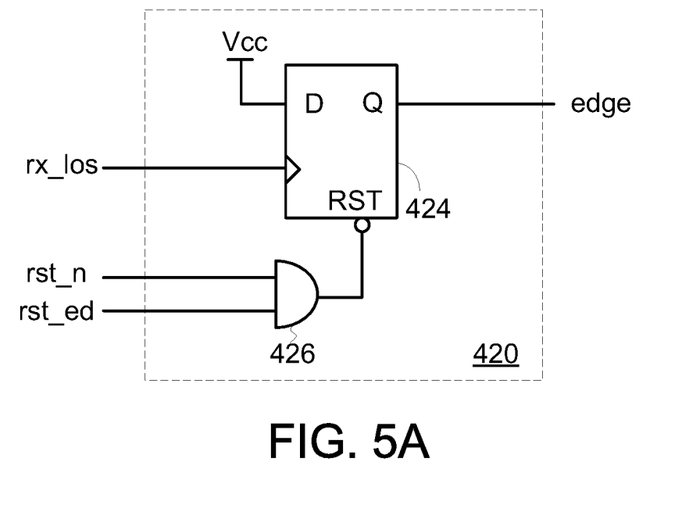
FIGS. 5A and 5B are schematic circuit diagrams illustrating two variant examples of the edge detecting unit used in the RXLOS deglitch apparatus of the present invention.
Figure 5B:
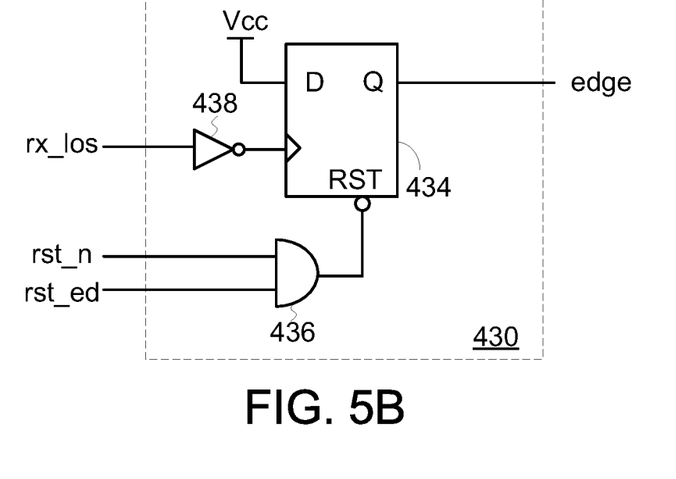

It is noted that numerous modifications and alterations may be made while retaining the teachings of the invention. FIGS. 5A and 5B are schematic circuit diagrams illustrating two variant examples of the edge detecting unit used in the RXLOS deglitch apparatus of the present invention. In FIG. 5A, the edge detecting unit 420 comprises the rising edge detector only. In FIG. 5B, the edge detecting unit 430 comprises the falling edge detector only.

As shown in FIG. 5A, the edge detecting unit 420 comprises a D flip-flop 424 and an AND gate 426. A signal input terminal D of the D flip-flop 424 receives the first logic level Vcc, a clock input terminal of the D flip-flop 424 receives the RXLOS signal rx_los, and an output terminal Q of the D flip-flop 424 generates the edge detection signal (edge). Moreover, the system reset signal rst_n and the edge rest signal rst_ed are respectively received by two input terminals of an AND gate 426, and an output terminal of the AND gate 426 is connected with a reset terminal RST of the D flip-flop 424. Consequently, when the level state of the RXLOS signal rx_los is changed, the edge detecting unit 420 generates the edge detection signal (edge) according to the rising edge of the RXLOS signal rx_los.

As shown in FIG. 5B, the edge detecting unit 430 comprises a D flip-flop 434, an inverter 438 and an AND gate 436. An input terminal of the inverter 438 receives the RXLOS signal rx_los, and an output terminal of the inverter 438 generates the inverted RXLOS signal rx_los. The inverted RXLOS signal rx_los is sent to a clock input terminal of the D flip-flop 434. Moreover, a signal input terminal D of the D flip-flop 434 receives the first logic level Vcc, and an output terminal Q of the D flip-flop 434 generates the edge detection signal (edge). Moreover, the system reset signal rst_n and the edge rest signal rst_ed are respectively received by two input terminals of an AND gate 436, and an output terminal of the AND gate 436 is connected with a reset terminal RST of the D flip-flop 434. Consequently, when the level state of the RXLOS signal rx_los is changed, the edge detecting unit 430 generates the edge detection signal (edge) according to the falling edge of the RXLOS signal rx_los.

From the above descriptions, the present invention provides the RXLOS deglitch apparatus and the RXLOS deglitch method for a serializer/deserializer (SerDes). The RXLOS deglitch apparatus is arranged between the front end circuit and the rear end controller of the receiver (Rx). The RXLOS deglitch apparatus receives the RXLOS signal rx_los from the front end circuit and filters off the glitches of the RXLOS signal rx_los. Moreover, the RXLOS deglitch apparatus outputs the filtered RXLOS signal rx_los_f to the rear end controller.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A RXLOS deglitch apparatus for a receiver, the RXLOS deglitch apparatus comprising:
a sampler receiving a recovered clock, and sampling a RXLOS signal according to the recovered clock, thereby generating a sampled RXLOS signal;
an edge detecting unit receiving the RXLOS signal, wherein the edge detecting unit includes at least one D flip-flop having a signal input terminal receiving a first logic level and a clock terminal receiving the RXLOS signal or an inverted RXLOS signal, and when a logic level of the RXLOS signal is changed, an edge detection signal is activated by the edge detecting unit; and
a finite state machine receiving the edge detection signal and the sampled RXLOS signal, generating an edge rest signal to control the edge detecting unit, and outputting a filtered RXLOS signal.

2. The RXLOS deglitch apparatus as claimed in claim 1, wherein the receiver comprises:
a front end circuit generating the RXLOS signal and the recovered clock; and
a rear end controller receives the filtered RXLOS signal.

3. The RXLOS deglitch apparatus as claimed in claim 1, wherein the sampler comprises a first D flip-flop, wherein a signal input terminal of the first D flip-flop receives the RXLOS signal, a clock input terminal of the first D flip-flop receives the recovered clock, and an output terminal of the first D flip-flop generates the sampled RXLOS signal.

4. The RXLOS deglitch apparatus as claimed in claim 1, wherein the edge detecting unit comprises:

a second D flip-flop, wherein a signal input terminal of the second D flip-flop receives the first logic level, a clock input terminal of the second D flip-flop receives the RXLOS signal, and an output terminal of the second D flip-flop generates a rising edge detection signal; and a third D flip-flop, wherein a signal input terminal of the third D flip-flop receives the first logic level, a clock input terminal of the third D flip-flop receives an inverted RXLOS signal, and an output terminal of the third D flip-flop generates a falling edge detection signal, wherein when the edge rest signal is activated, the second D flip-flop and the third D flip-flop are reset, wherein when one of the rising edge detection signal and the falling edge detection signal is activated, the edge detection signal is activated.

5. The RXLOS deglitch apparatus as claimed in claim 1, wherein the edge detecting unit comprises a fourth D flip-flop, wherein a signal input terminal of the fourth D flip-flop receives the first logic level, a clock input terminal of the fourth D flip-flop receives the RXLOS signal, and an output terminal of the fourth D flip-flop generates the edge detection signal, wherein when the edge rest signal is activated, the fourth D flip-flop is reset.

6. The RXLOS deglitch apparatus as claimed in claim 1, wherein the edge detecting unit comprises an inverter receiving the RXLOS signal and outputting the inverted RXLOS signal; and a fifth D flip-flop, wherein a signal input terminal of the fifth D flip-flop receives the first logic level, a clock input terminal of the fifth D flip-flop receives the inverted RXLOS signal, and an output terminal of the fifth D flip-flop generates the edge detection signal, wherein when the edge rest signal is activated, the fifth D flip-flop is reset.

7. The RXLOS deglitch apparatus as claimed in claim 1, wherein when the finite state machine is in a first state, if the sampled RXLOS signal is changed from the first logic level state to a second logic level state or the edge detection signal is activated, the finite state machine enters a second state.

8. The RXLOS deglitch apparatus as claimed in claim 7, wherein when the finite state machine is in the second state, the edge rest signal is activated, and then the finite state machine enters a third state.

9. The RXLOS deglitch apparatus as claimed in claim 8, wherein when the finite state machine is in the third state, if the sampled RXLOS signal is in the second logic level state or the edge detection signal is activated, the finite state machine enters a fourth state, wherein when the finite state machine is in the third state, if the edge detection signal is inactivated for a first time interval, the finite state machine enters the first state.

10. The RXLOS deglitch apparatus as claimed in claim 9, wherein when the finite state machine is in the fourth state, the filtered RXLOS signal is set to be in the second logic level state, and the edge rest signal is activated, wherein when the finite state machine is in the fourth state, if the sampled RXLOS signal is in the first logic level state, the finite state machine enters a fifth state.

11. The RXLOS deglitch apparatus as claimed in claim 10, wherein when the finite state machine is in the fifth state, if the sampled RXLOS signal is in the second logic level state or the edge detection signal is activated, the finite state machine enters the fourth state, wherein when the finite state machine is in the fifth state, if the edge detection signal is inactivated for a second time interval, the finite state machine enters a sixth state.

12. The RXLOS deglitch apparatus as claimed in claim 11, wherein when the finite state machine is in the sixth state, the filtered RXLOS signal is set to be in the first logic level state and the edge rest signal is activated, and then the finite state machine enters the first state.

\* \* \* \* \*